(12) United States Patent
Wijeratne

(10) Patent No.: US 7,202,703 B2
(45) Date of Patent: Apr. 10, 2007

(54) SINGLE STAGE LEVEL RESTORE CIRCUIT WITH HOLD FUNCTIONALITY

(75) Inventor: Sapumal Wijeratne, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 491 days.

(21) Appl. No.: 10/769,172

(22) Filed: Jan. 30, 2004

(65) Prior Publication Data

US 2005/0169074 A1 Aug. 4, 2005

(51) Int. Cl.
H03K 19/096 (2006.01)
H03K 3/289 (2006.01)

(52) U.S. Cl. .......................... 326/98; 326/95; 327/203; 327/200

(58) Field of Classification Search ................. 326/98; 327/203
See application file for complete search history.

(56) References Cited

U.S. PATENT DOCUMENTS

| | | | |
|---|---|---|---|
| 5,278,467 A | 1/1994 | Nedwek | |
| 6,429,692 B1 * | 8/2002 | Chan et al. | 326/127 |
| 6,507,228 B2 * | 1/2003 | Boerstler et al. | 327/199 |
| 6,693,476 B1 * | 2/2004 | Lin | 327/203 |
| 6,861,888 B2 * | 3/2005 | Hsieh | 327/208 |
| 6,958,629 B2 * | 10/2005 | Wijeratne | 326/93 |

* cited by examiner

*Primary Examiner*—Vibol Tan
(74) *Attorney, Agent, or Firm*—Schwabe, Williamson & Wyatt, P.C.

(57) ABSTRACT

A circuit comprises an evaluate clock trace to receive an evaluate clock signal and a precharge clock trace to receive a precharge clock signal. The circuit further comprises sample circuitry coupled to a first signal trace, a second signal trace, the precharge clock trace and the evaluate clock trace to facilitate a detection of a transition on the first signal trace from a first voltage level to a second voltage level. In addition, the circuit comprises latch circuitry coupled to the first signal trace, the second signal trace, the precharge clock trace and the evaluate clock trace to utilize at least a portion of the sample circuitry to maintain voltage levels on the first and the second signal traces when an evaluate clock and a precharge clock are inactive.

18 Claims, 6 Drawing Sheets

SINGLE STAGE LEVEL RESTORE CIRCUIT WITH HOLD FUNCTIONALITY

BACKGROUND

1. Field of the Invention

Embodiments of the present invention relate to integrated circuit design, and, more particularly, to input processing of differential pair inputs.

2. Description of the Related Art

The current state of integrated circuit technology is such that circuit designs are able to process data at rates which can challenge the ability to provide sufficient input data to keep the circuit designs at a high operating efficiency. Thus, the frequency of data transfer between circuit designs continues to increase, resulting in increase signal frequencies. This increase in signal frequency applies to both interchip as well as intrachip communication. For example, an address generation circuit in a processor may be in need of obtaining a cached address from an on-chip cache. With the operating frequency of the address generating circuit rapidly increasing with successive generations of integrated circuit technology, providing timely data from the cache to the address generating circuit may be a challenge. Thus, the communication link between the cache and the address generation unit may attempt to use a high-speed communication link.

Differential signaling, as opposed to single ended signaling, provides advantages that may result in an increased maximum operating frequency. In differential signaling, typically two component signals (sometimes referred to as a differential pair) are used to transmit data instead of one signal, as with single ended signaling. The data value on a differential pair is represented as the difference between the voltage on the two signal components. An example of a common differential signaling protocol is low-voltage differential signaling (LVDS). LVDS uses high-speed analog circuit techniques to provide data transfers on interconnects and is a generic interface standard for high-speed data transmission.

Differential signaling provides a number of benefits. Many noise sources are not local to a differential pair. Thus, these noise sources will affect both signals of the differential pair relatively evenly. By affecting both signals of the differential pair relatively evenly, the difference between the two signals will remain relatively constant. Thus, differential signaling provides improved noise immunity compared to a single wire solution. Other advantages are associated with differential signaling as well. When low voltage differential signaling is utilized, the low voltage differential allows for higher switching speeds when compared to large voltage differential signaling and single ended signaling. Thus, differential signaling provides advantages over traditional single ended signaling and is therefore utilized to provide a high-speed communication link between a source and a destination function block.

BRIEF DESCRIPTION OF THE DRAWINGS

Embodiments of the present invention will be described referencing the accompanying drawings in which like references denote similar elements, and in which.

DETAILED DESCRIPTION OF EMBODIMENTS OF THE INVENTION

In the following description, various aspects of the embodiments of the invention will be described. However, it will be apparent to those skilled in the art that other embodiments may be practiced with only some or all of these aspects. For purposes of explanation, specific numbers, materials and configurations are set forth in order to provide a thorough understanding of these embodiments. However, it will also be apparent to one skilled in the art that other embodiments may be practiced without the specific details. In other instances, well-known features are omitted or simplified in order not to obscure the description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. A signal is an electrical signal that is carried on the metal lines, traces, wires, conductors, signal paths and signaling mediums.

Figure 1:
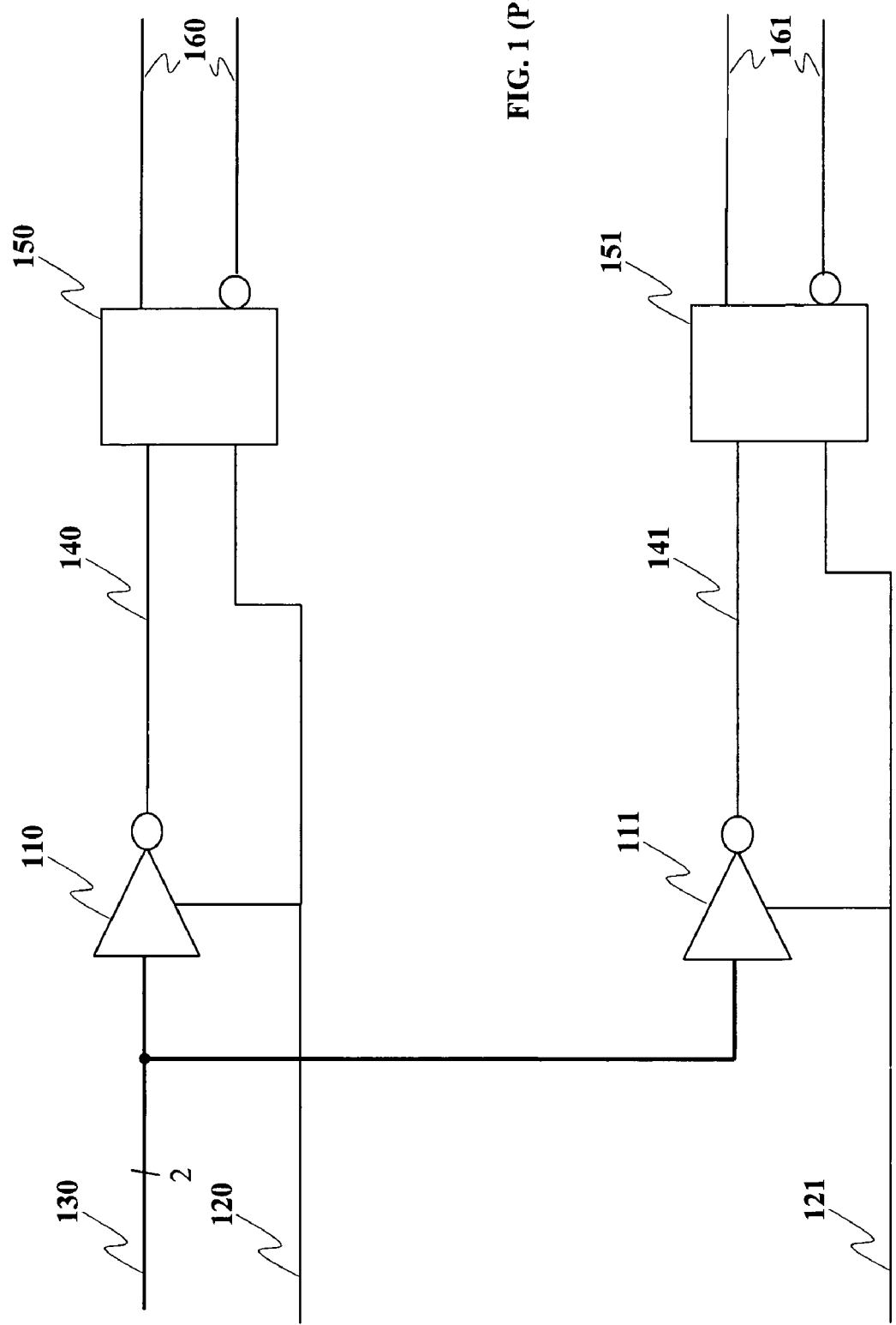
FIG. 1 illustrates a prior art circuit to perform level restore, demultiplexing and latching utilizing a two-stage approach.

FIG. 1 illustrates a prior art circuit to perform level restore, demultiplexing and latching utilizing a two-stage approach. In this design, input signals 130 are provided to the inputs of two cross-coupled domino logic inverters 110–111. Cross-coupled domino logic inverters 110–111 provide sampling functions to sample input values. Cross-coupled domino logic inverters 110–111 each sample in a first phase of different clocks 120–121 to allow the data provided on the input signal traces 130 to be correspondingly de-multiplexed to signals 140–141. The cross-coupled domino logic inverters 110–111 also perform level restore functionality. The input signal traces 130 carry small signal, sense amplified signals from a sense amplifier. The level restore function results in signals on traces 140–141 reflecting "full rail" digital signal values corresponding to the small signal, sense amplified values. In a second phase of the different clocks 120–121, the signals 140–141 are latched into corresponding latches 150–151. Thus, given two small signal, sense amplified inputs signals, the devices generate two demultiplexed, frequency transformed, "full rail" signals 160–161 each having complementary outputs.

Figure 2:
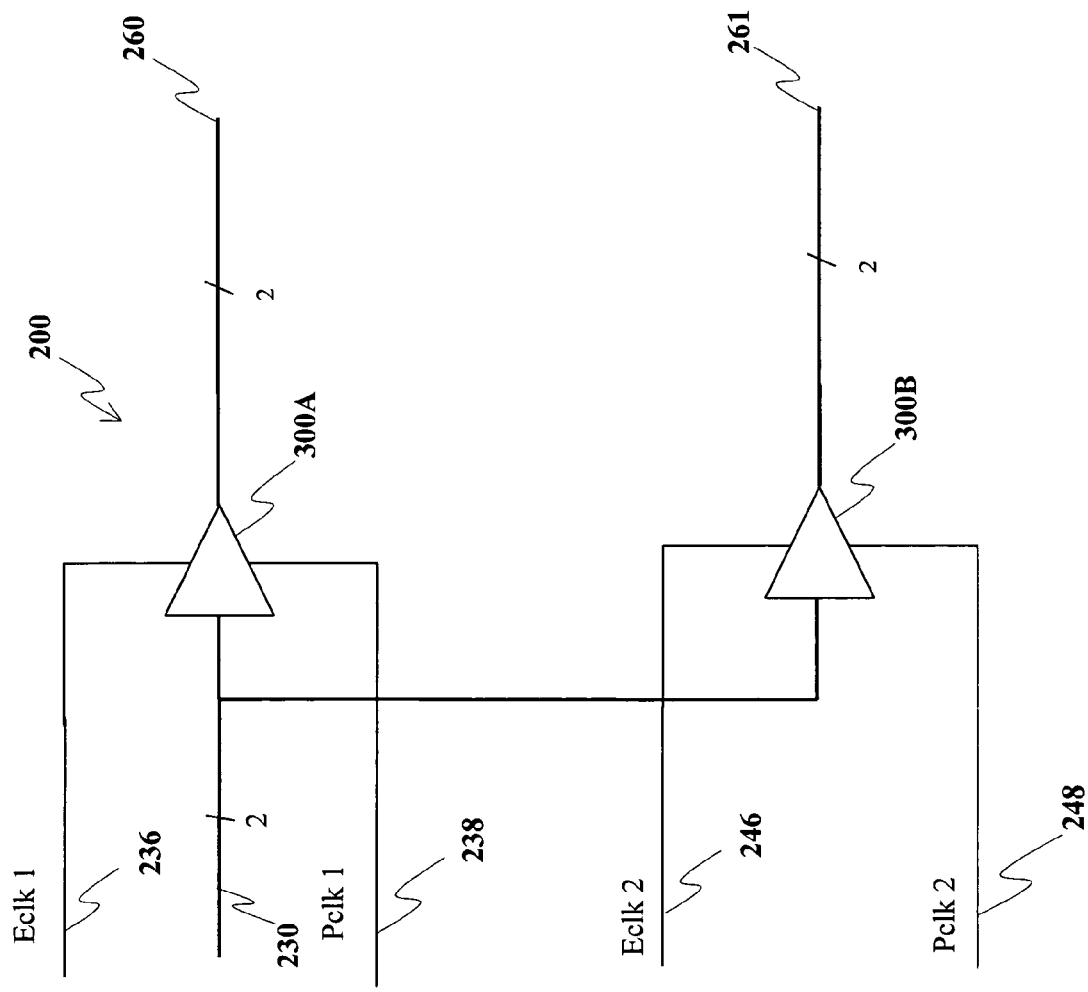
FIG. 2 illustrates a design utilizing two improved level restore devices, in accordance with one embodiment.

FIG. 2 illustrates a circuit 200 utilizing two improved devices 300A–300B, in accordance with one embodiment. Input signal traces 230 are advantageously demultiplexed and latched employing a circuit 200 which utilizes improved devices 300A–300B. As depicted, the signal traces 230 comprises two traces that split into a first pair of traces that is coupled to the improved device 300A and a second pair of the traces that is coupled to the improved device 300B. These two improved devices 300A–300B advantageously combine the two functions provided by the prior art devices, the sampled/level restore and latch functionality, into a single stage device. Utilizing a single stage design may result in a faster implementation when compared to two-stage implementation discussed above in FIG. 1, as the circuit 200 utilizing the improved devices 300A–300B performs the same functions as the circuit of FIG. 1 with only one inverting stage, while the implementation in FIG. 1 requires two inverting stages.

In the architecture of FIG. 2, each improved device 300A–300B is clocked by separate precharge and evaluate clocks. Thus, a first improved device 300A associated with a first pair of level restored, complementary, digital outputs 260 is clocked by a first precharge clock 236 and a first evaluate clock 238. A second improved device 300B associated with a second pair of level restored, complementary, digital outputs 261 is clocked by a second precharge clock 246 and a second evaluate clock 248.

As noted, the improved devices 300A–300B provides level restore and latching functions. As mentioned the improved devices may process an input signal comprising a small signal, differential pair. Thus, a single improved device may process an input signal containing two alternating data streams, s1 and s2, on the input signal. When desired, to perform a frequency transformation on s1, the improved device may sample s1, convert it to a slower frequency signal that is half of the input frequency and provide this half frequency signal to an appropriate block for subsequent processing. In addition, when two improved devices are utilized together and clocked as described below, they provide demultiplexing functions for an input signal containing two alternating data streams.

Figure 3:
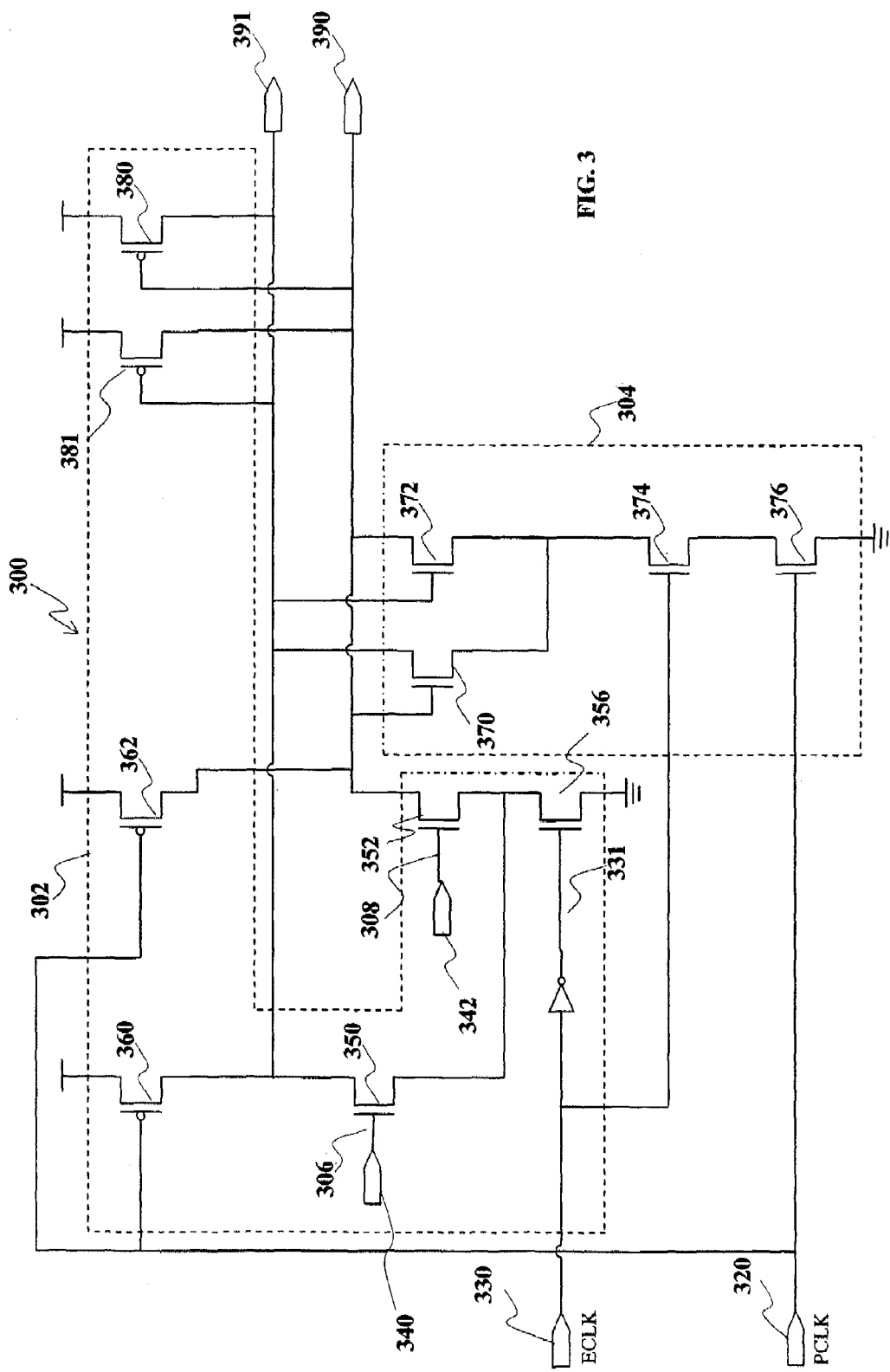
FIG. 3 illustrates an architecture for an improved level restore circuit in accordance with one embodiment.
Figure 4:
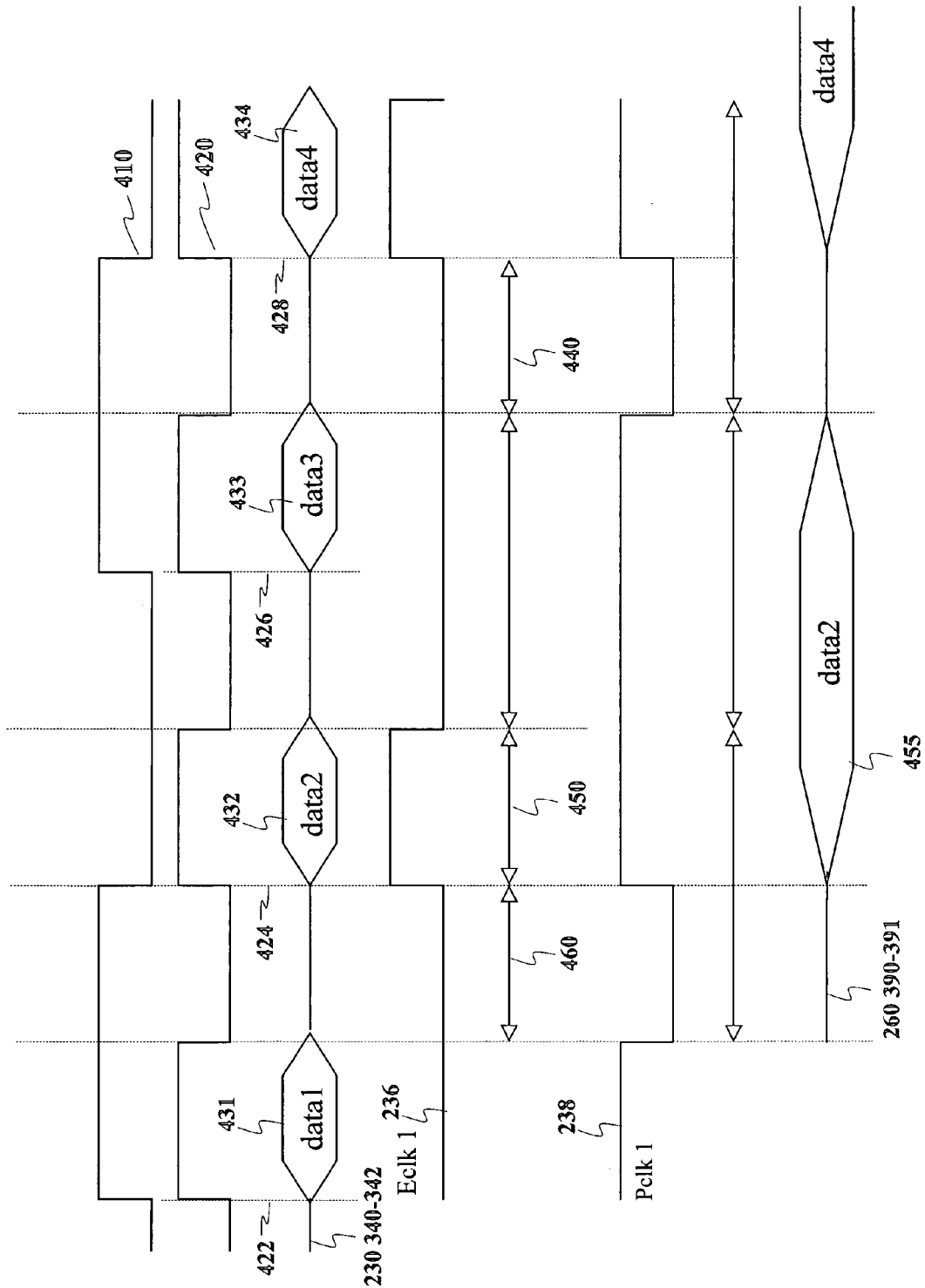
FIG. 4 illustrates a timing diagram illustrating the precharge, evaluate and hold periods for an improved level restore device.

FIG. 3 illustrates an architecture for an improved device 300, representing devices 300A and 300B, in accordance with one embodiment. As depicted, the improved device 300 includes a sample circuitry 302 and a latch circuitry 304. The sample circuitry 302 includes N-MOSFET devices 350, 352, 356 and P-MOSFET devices 360, 362, 380, 381, while the latch circuitry 304 includes N-MOSFET devices 370, 372, 374, and 376. FIG. 4 illustrates a timing diagram showing the precharge, evaluate and hold periods for the improved device 300A, illustrated in FIGS. 2&3. Included in the illustration of FIG. 4 are fast 420 and slow 410 reference clocks utilized to aid in the explanation the function of improved device 300.

In the embodiment illustrated in FIG. 3, improved device inputs 340–342 are driven by two sense amplified input, precharged low signals. As depicted, the inputs 340–342 are provided to the device 300 via the traces 230 of FIG. 2, which are coupled to traces 306–308 of the device 300. The sense amplifier (not shown) performs sense amplification of differential pair inputs and provides a pair of sense amplified outputs. In one embodiment, the sense amplified outputs are small signal outputs. The type of sense amplifier utilized depends upon the type of differential signaling performed on the differential pair inputs to the sense amplifiers. In addition to performing a sense amplification operation on differential pair inputs, in the embodiment illustrated, the sense amplifier performs a precharge low function on the outputs of the sense amplifier during the inactive (low) period of fast clock 420. Sense amplifier is represented by various devices known in the art and will not be further described. The resulting signals that are provided on inputs 340–342 to the improved device 300 are two sense amplified, precharged low signals.

Referring to FIG. 4, the two precharged low, small signals 230 340–342 contain new values, with alternating data, on the rising edge 422–428 of every fast clock cycle 420. Illustrated for explanation purposes are four separate data, data1-data4 431–434. Referring to data2 432, for ½ of a fast clock period 460 prior to the arrival of new data on the inputs 230 340–342, precharge clock 238 320 transitions to a low voltage activating precharge P-MOSFET devices 360–362 which precharge outputs 260 390–391 to a high voltage. As previously discussed, during the precharge period 460 of fast clock cycle 420, the two signals on inputs 230 340–342 are precharged to a low voltage by the sense amplifier (not shown). The circuit providing clock and data signals to the improved circuit operate such that, substantially concurrent with the arrival of data2 inputs 340–342, the precharge clock 238 320 is deasserted and the evaluation clock 236 330 is asserted. When the precharge clock 238 320 is deasserted, precharged low signals on inputs 230 340–342 are allowed to be driven, as appropriate, based on differential pair inputs to the sense amplifier. The assertion of the evaluation clock 236 330 activates evaluation N-MOSFET device 356 and allows evaluation devices 350–352 to drive outputs 260 390–391 based on the signals on inputs 230 340–342.

When precharged signals on inputs 230 340–342 are released from their precharged low voltage levels, each is able to change voltage from its precharged low voltage. However, noise may exist on the precharged low signals on inputs 230 340–342 provided by the sense amplifier. This noise may be noise induced by the sense amplifier or common mode noise on the inputs to the sense amplifier. As a result, while only one of the precharged low signals on inputs 230 340–342 may be designed to rise after release from the precharged low state, noise on the other signal may cause that signal to rise as well. Consequently, the possibility of noise on the signals on inputs 230 340–342 should be accounted for in the design of subsequent portions of the logic stage.

Referring to FIGS. 3&4, as an example assume a first input 340 is driven by a signal that is to undergo a low to high voltage transition after a precharge period 460 is over. Assume further that a second input 342 contains a signal to remain at a low voltage after the precharge period 460. These values result from sense amplifier's operation on the differential pair input to the sense amplifier. However, during the evaluation period 450, both inputs may begin to rise as a result of noise present on second input 342. However, the first input 340, being the driven high input, will likely rise more rapidly than the second input 342. Consequently, corresponding N-MOSFET device 350 turns on before N-MOSFET device 352.

Because of the precharge of outputs 260 390–391 to a high voltage, P-MOSFET devices 380–381 are inactive. Thus, immediately after the precharging of outputs 260 390–391, P-MOSFET devices 380–381 have no effect on outputs 260 390–391. However, as signals on inputs 230 340–342 begin to change, P-MOSFET devices 380–381 provide, among other functions, a pseudo-noise filter function. Noise that appears on the inputs 230 340–342 to the improved device 300A, as the signals on those inputs 230 340–342 exit their precharge state, may be filtered by the actions of P-MOSFET devices 380–381. When output 391 begins to be driven to a low voltage by N-MOSFET device 350, this drop in voltage activates corresponding P-MOSFET device 381. As a result of the activation of P-MOSFET device 381, output 390 will be driven to a high voltage. However, after precharge, noise on the second input 342 may also cause a rise in the signal on the second input 342. As a result of this noise, N-MOSFET device 352 also begins to turn on. This results in an attempt to drive output 390 to a low voltage. As noted, however, this output is already being kept at a high voltage by P-MOSFET device 381. In the embodiment illustrated, the P-MOSFET device 381 may ensure that attempts by noise on input 342 to drive output 390 to a lower voltage will not be successful. The result is robust, complementary outputs at digital logic levels on outputs 260 390–391. Thus, the improved device 300, described above, may provide sample and level restore functions for signals on inputs 230 340–342.

In addition to the sample and level restore function which may be provided by the improved device 300A, the device may perform a latching function as well. As illustrated, within one fast clock phase 450, the evaluation device is disabled. At this point, neither the precharge nor evaluation portions of the circuit are enabled. However, the enabled cross-coupled, N-only half keeper, comprised of a number NMOS transistors 370–376, is enabled by the de-assertion of both the precharge 238 320 and evaluate 236 330 clocks. The N-only half keeper 370–376 together with cross-coupled PMOS devices 380–381 form a cross-coupled inverter pair that will hold the signal value on outputs 260 390–391. As illustrated in FIG. 4, the signal 455 on outputs 260 390–391, corresponding to data2 432 is held until the next precharge 440 of the improved device 300A. Thus, utilizing the hold functionality of the improved device, the signal 455 on outputs 260 390–391 corresponding to data2 432 has a pulse-width that is comparable to that of a slow-frequency signal 410. The result is that the fast frequency signal data2 432 in FIG. 4 has been transformed to a slow-frequency signal 455. Slow-frequency signals on outputs 260 390–391 of device 300A contain every other data value provided on inputs 230 340–342. Thus, the data on outputs 260 390–391 represents latched data that corresponds to small signal data on inputs 230 340–342 that have been level restored.

The other improved device illustrated in FIG. 2 300B may be utilized to capture, e.g. sample and latch, the data not captured by device 300A. For example, if device 300A captures data2 data4 data6 etc., improved device 300B may capture data1 data3 data5, etc. Improved device 300B converts these other captured data values, in a fast frequency domain, to the slow frequency domain in a similar manner as that discussed above with respect to device 300A. Thus, the circuit illustrated in FIG. 2 may be utilized to perform level-restore, frequency transform and de-multiplexing of a small signal, fast frequency data on inputs 230 340–342 utilizing only a single stage.

Figure 5:
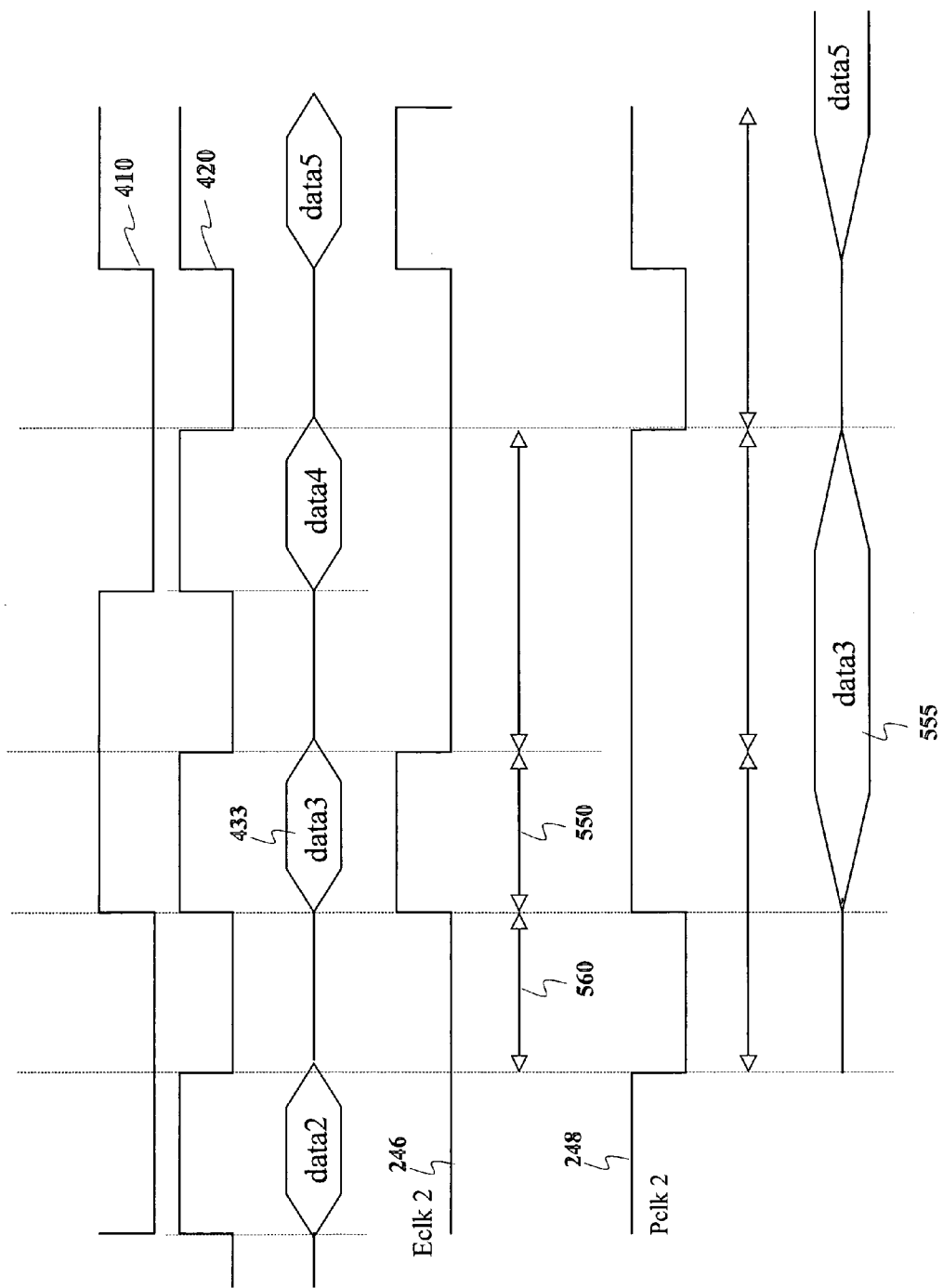
FIG. 5 illustrates a timing diagram illustrating the precharge, evaluate and hold periods for a second improved level restore device.

FIG. 5 illustrates a timing diagram for the second improved device 300B illustrated in FIG. 2. As previous discussed, improved device 300A maintains the captured data values on the output for two fast clock cycles. As a result, improved device 300A is unavailable to sample data3 on inputs 340 342. Thus, improved device 300B is utilized to capture data3. As illustrated, the timing for the precharge 248 320 and evaluation 246 330 clocks for improved device 300B is similar to that of the precharge 238 320 and evaluation 236 330 clocks for improved device 300A. However, the precharge 248 320 and evaluation 246 330 clocks are timed to capture data3 on outputs 261 390–391. In addition, in a manner similar to that discussed above with respect to data2, the N-only half keeper 370–376 together with cross-coupled PMOS devices 380–381 form a cross-coupled inverter pair that will hold the signal value, data3, on outputs 261 390–391. Thus, fast frequency signal data3 433 has also been transformed to a slow-frequency signal 555. Thus, slow-frequency outputs 261 390–391 on device 300B contain captured, alternating data values provided on differential inputs pairs 230 340–342. However, the captured alternating data is the data not captured by device 300A.

Thus, the improved device disclosed herein, when operating on small signal input provides a single stage sampling circuit that includes latch functionality. When used in combination with another device that performs similar functions, the devices combine to provide a single stage sampling circuit that may de-multiplex a fast-clock, small-signal input signal into two frequency transformed, "full-rail" digital output signals.

Figure 6:
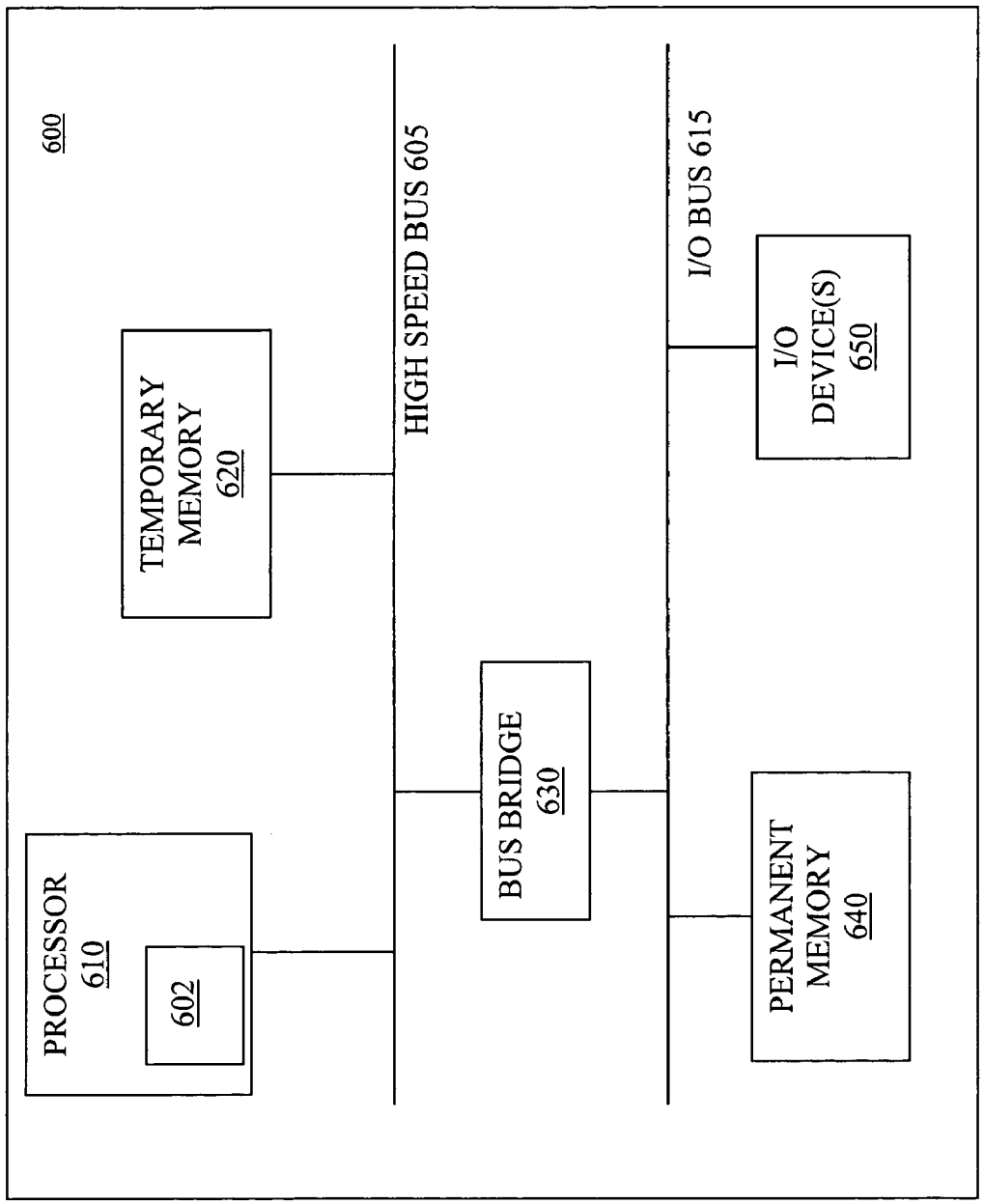
FIG. 6 illustrates is a block diagram of a computer system including a level restore circuit including hold functionality.

FIG. 6 illustrates is a block diagram of a computer system 600 including one or more level restore circuits including hold functionality 602. As shown, the computer system 600 includes a processor 610 and temporary memory 620, such as SDRAM and DRAM, on high-speed bus 605. Level restore circuit(s) 602, incorporated with the earlier described improved design, advantageously provides single stage level restore and latch functionality for communication between blocks of processor 610. High-speed bus is connected through bus bridge 630 to input/output (I/O) bus 615. I/O bus 615 connects permanent memory 640, such as flash devices and fixed disk device, and I/O devices 650 to each other and bus bridge 630.

Thus, a unique design of a single stage sample, level restore and latch circuit is provided. While the invention has been described in accordance with a number of embodiments, the invention should not be considered so limited. One skilled in the art will recognize that various other embodiments can be utilized to provide the advantages described herein.

What is claimed is:

1. A circuit comprising:
   an evaluate clock trace to receive an evaluate clock signal;
   a precharge clock trace to receive a precharge clock signal;
   sample circuitry coupled to a first signal trace, a second signal trace, the precharge clock trace and the evaluate clock trace, the sample circuitry to facilitate a detection of a transition on the first signal trace from a first voltage level to a second voltage level;
   latch circuitry coupled to the first signal trace, the second signal trace, the precharge clock trace and the evaluate clock trace to utilize at least a portion of the sample circuitry to maintain voltage levels on the first and the second signal traces when an evaluate clock and a precharge clock are inactive; and
   wherein the sample circuitry comprises:
   evaluate circuitry coupled to a third signal trace, a fourth signal trace and the evaluate clock trace to facilitate coupling the third and the fourth signal traces to the first and the second signal traces, respectively; and
   precharge circuitry coupled to the first signal trace, the second signal trace and the precharge clock trace independent of the evaluate circuitry to precharge the first and the second signal traces to the first voltage level independent of the evaluate circuitry.

2. The circuit of claim 1 wherein the sample circuitry is designed to reinforce the second voltage level on the first signal trace and to assert the first voltage level on the second signal trace, based at least in part on the result of the detection of a transition.

3. The circuit of claim 1 wherein the sample circuitry is designed to detect a transition on the first signal trace during an active period of the evaluate clock.

4. The apparatus of claim 1 wherein the precharge circuitry comprises two P-MOSFET devices coupled to the first signal trace, the second signal trace and the precharge clock trace.

5. The apparatus of claim 1 wherein the evaluate circuitry comprises two N-MOSFET devices coupled to the evaluate clock, the third and the fourth signal traces.

6. The apparatus of claim 5 wherein the evaluate circuitry is further coupled to the first and the second signal trace and wherein the sample circuitry further comprises cross-coupled P-MOSFET devices coupled to the first and the second signal traces.

7. The circuit of claim 1 wherein the first voltage level is a substantially high voltage level and the second voltage level is a substantially low voltage level.

8. The circuit of claim 1 wherein the latch circuitry comprises a cross-coupled N-MOSFET only half keeper.

9. The circuit of claim 1 wherein the sample circuitry comprises cross-coupled P-MOSFET devices.

10. The circuit of claim 9 and wherein the latch circuitry comprises a cross-coupled N-MOSFET only half keeper coupled to the cross-coupled P-MOSFET devices.

11. An apparatus comprising:
a first and second circuit wherein each circuit comprises:
an evaluate clock trace to receive an evaluate clock signal;
a precharge clock trace to receive a precharge clock signal;
sample circuitry coupled to a first signal trace, a second signal trace, the precharge clock trace and the evaluate clock trace, the sample circuitry to facilitate a detection of a transition on the first signal trace from a first voltage level to a second voltage level; and
latch circuitry coupled to the first signal trace, the second signal trace, the precharge clock trace and the evaluate clock trace to utilize at least a portion of the sample circuitry to maintain voltage levels on the first and the second signal traces when the evaluate clock signal and the precharge clock signal are inactive;
a first and a second input signal trace correspondingly coupled to a third and a fourth signal trace of each of the first and the second circuits;
a first and a second clock trace correspondingly coupled to the precharge clock trace of the first and the second circuit, to facilitate provision of the corresponding circuit's precharge clock signal; and
a third and fourth clock trace correspondingly coupled to the evaluate clock trace of the first and the second circuit, to facilitate provision of the corresponding circuit's evaluation clock signal.

12. The apparatus of claim 11 wherein each of the first and the second circuit comprise:
evaluate circuitry coupled to the third signal trace, the fourth signal trace and the evaluate clock trace to facilitate coupling the third and the fourth signal traces to the first and the second signal traces, respectively; and
precharge circuitry coupled to the first signal trace, the second signal trace and the precharge clock trace to precharge the first and second signal traces to the first voltage level.

13. The apparatus of claim 11 wherein the sample circuitry for the first and the second circuit comprises cross-coupled P-MOSFET devices.

14. The apparatus of claim 13 and wherein the latch circuitry of the first and the second circuit comprises a cross-coupled N-MOSFET only half keeper coupled to the corresponding cross-coupled P-MOSFET devices.

15. A system comprising:
a processor including;
a first and second circuit wherein each circuit comprises:
an evaluate clock trace to receive an evaluate clock signal;
a precharge clock trace to receive a precharge clock signal;
sample circuitry coupled to a first signal trace, a second signal trace, the precharge clock trace and the evaluate clock trace, the sample circuitry to facilitate a detection of a transition on the first signal trace from a first voltage level to a second voltage level; and
latch circuitry coupled to the first signal trace, the second signal trace, the precharge clock trace and the evaluate clock trace to utilize at least a portion of the sample circuitry to maintain voltage levels on the first and the second signal traces when the evaluate clock signal and the precharge clock signal are inactive;
a first and a second input signal trace correspondingly coupled to a third and a fourth signal trace of each of the first and the second circuits;
a first and a second clock trace correspondingly coupled to the precharge clock trace of the first and the second circuit, to facilitate provision of the corresponding circuit's precharge clock signal; and
a third and fourth clock trace correspondingly coupled to the evaluate clock trace of the first and the second circuit, to facilitate provision of the corresponding circuit's evaluation clock signal;
a memory configured to store data; and
a bus coupled to the processor and memory to facilitate data exchange between the processor and memory.

16. The system of claim 15 wherein each of the first and the second circuit comprise:
evaluate circuitry coupled to the third signal trace, the fourth signal trace and the evaluate clock trace to facilitate coupling the third and the fourth signal traces to the first and the second signal traces, respectively; and
precharge circuitry coupled to the first signal trace, the second signal trace and the precharge clock trace to precharge the first and second signal traces to the first voltage level.

17. The system of claim 15 wherein the sample circuitry of the first and the second circuit comprises cross-coupled P-MOSFET devices.

18. The system of claim 17 and wherein the latch circuitry of the first and the second circuit comprises a cross-coupled N-MOSFET only half keeper coupled to the corresponding cross-coupled P-MOSFET devices.

* * * * *